1

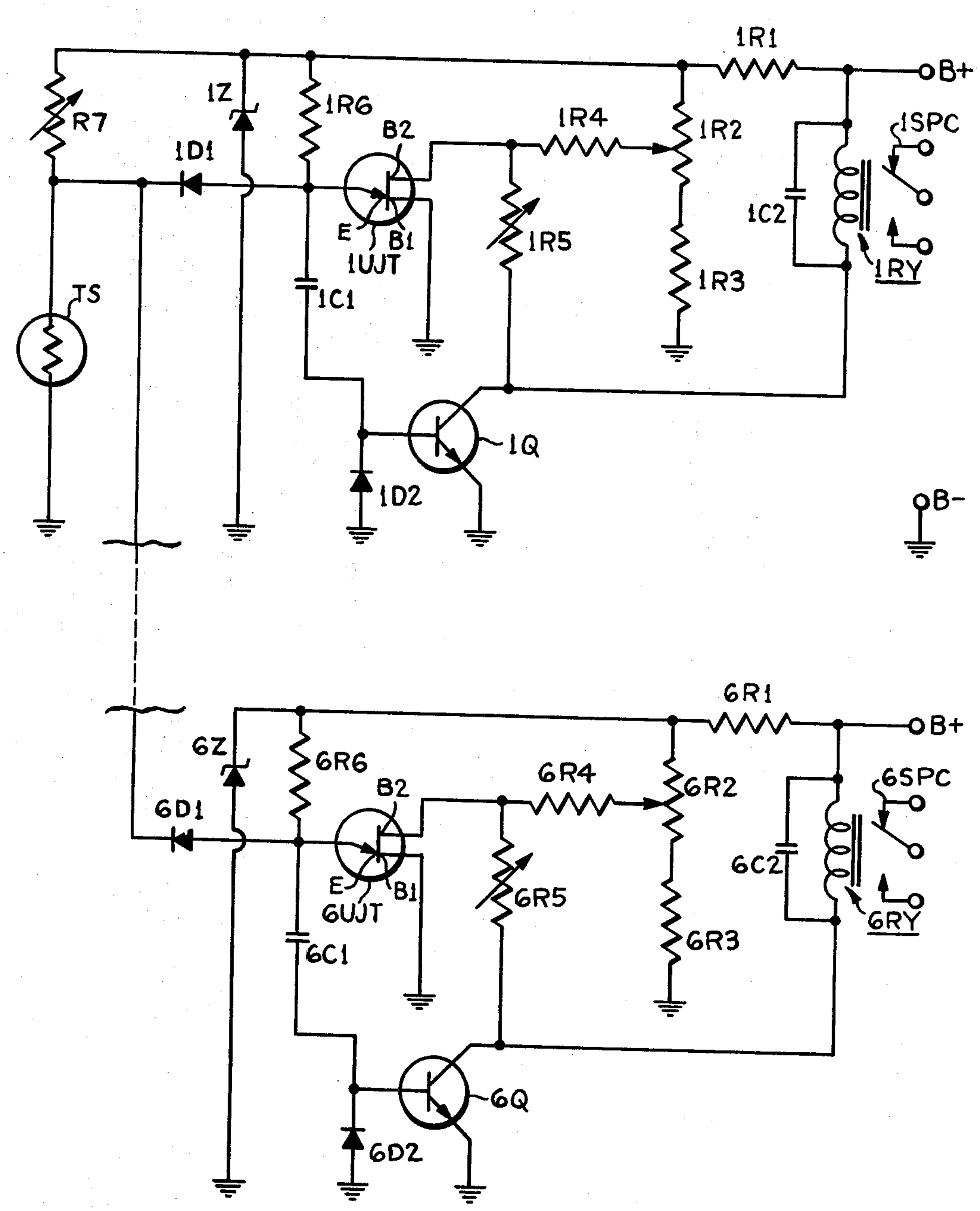
DWIGHT C. LEWIS INVENTOR.
BY A. J. De Angelis
ATTORNEY.

3,541,359
SINGLE AND MULTISTAGE ELECTRONIC SWITCHING CONTROL WITH ADJUSTABLE OPERATING DIFFERENTIAL

Dwight Charles Lewis, Elkhart, Ind., assignor to Penn Controls, Inc., Oak Brook, Ill.

Filed Sept. 29, 1967, Ser. No. 671,690
Int. Cl. H03k 5/08, 17/26
U.S. Cl. 307—310 12 Claims

ABSTRACT OF THE DISCLOSURE

A unijunction relaxation oscillator is clamped to a non-oscillating condition by a clamping diode connected to a voltage divider circuit, one leg of which comprises a condition responsive resistive element. When the divider junction rises above the firing point of the unijunction transistor, the oscillator is unclamped. A switching transistor is responsive to the oscillator output and is switched from fully "on" condition to fully "off" with each oscillation to control an electrical load. A diode shunts the base to emitter diode circuit of the switching transistor to provide a discharging path for the firing capacitor of the unijunction transistor, while the charging path of the firing capacitor is through the base-emitter diode circuit of the transistor. This allows a large output signal to be obtained from the oscillator without loading the circuit. Since, the discharge time of the firing capacitor is very small with respect to its charging time. The switching transistor is in the "off" condition a very small time each period of oscillation.

A variable resistor is connected between the switching transistor and the second base of the unijunction transistor to provide positive feedback around the switching circuit. This positive feedback lowers the base-to-base voltage and, in turn, proportionately lowers the firing point of the unijunction transistor. In order to reclamp the oscillator to non-oscillating condition the input signal at its trigger point must then return to a lower level. This provides an adjustable differential between the "on" and "off" conditions of the control.

An adjustable resistor is also provided in the base circuit of the unijunction transistor to preset the base-to-base voltage and, in turn, the firing point of the oscillator. A multistage controller is arranged by staging a plurality of individual controllers each through associated clamping diodes to a common input signal source and selecting their respective firing points so that the multistage controller operates as a sequencer.

The invention relates to an electronic switching control and more particularly to such a control having an easily adjustable operating differential and being readily adaptable to multistage interconnection to provide sequential switching operation or digital indication of a monitored condition.

In modern day controls for electrical apparatus, such as for relays, electrical heaters and lighting fixtures, it is usually necessary to provide positive switching from an

2

"on" to an "off" condition of the controlled load in response to a predetermined input control signal. This is often accomplished by providing a differential between the "on" and "off" switching conditions. It is desirable that the operating point of the switching control and its differential be easily adjustable for flexibility of application of the controls to differing input signals and loads. It is further desirable that such an electronic switch be readily interconnectable in multistage configuration for sequential switching operation or to provide a digital indication of a monitored condition, such as voltage or temperature.

It is, therefore, an object of the invention to provide an electronic transistorized switching control which is easily adjustable for selecting an operating point at which switching action occurrs in response to an input signal, and in which the differential between the switching "on" and "off" conditions is also readily adjustable.

It is a further object of the invention to provide such a control in which loading of the control by the output switching means in minimized.

It is still another object of the invention to provide such a control which is easily interconnectable into a multistage switch for sequential switching action in response to various conditions of an input signal.

In carrying out the invention according to a preferred embodiment there is provided a unijunction relaxation oscillator which is clamped to a non-oscillating condition by a clamping diode coupled to the junction of a voltage divider, one leg of which is a condition responsive resistive element. The voltage applied across the bases of the unijunction transistor is adjustable to select a firing point for the oscillator. The oscillator becomes unclamped when the control signal input through the clamping diode exceeds the predetermined firing point in response to a predetermined change in resistance of the condition responsive element. Connected to the output of the oscillator is a switching transistor having its base-emitter diode circuit shunted by an oppositely poled diode to provide a discharging circuit for a firing capacitor interconnected to the emitter of the unijunction transistor. The charging circuit for the firing capacitor is through the base-emitter diode circuit of the switching transistor. The charging action causes the switching transistor to conduct heavily through its emitter-collector circuit. Discharging of the firing capacitor, switches the switching transistor to the "off" condition. This manner of coupling the output switching transistor to the unijunction relaxation oscillator minimizes loading of the circuit, while obtaining a relatively large output signal.

Interconnected between the collector of the switching transistor and the second base of the unijunction transistor is a variable resistor which provides a positive feedback around the switching circuit. This variable resistor is preset to a value to provide a preselected differential between the "on" and "off" conditions of the oscillator. Current flow through the resistor lowers the voltage magnitude between the bases of the unijunction transistor which, in turn, proportionately lowers the voltage level required at the emitter of the unijunction transistor to cause oscillation. This requires the clamping voltage applied to the unijunction transistor to decrease to a proportionately lower value in order to stop oscillation. In this manner, the input control signal from the voltage divider applied through the clamping diode to the unijunction transistor causes switching action with a predetermined differential which is easily adjustable by means of a variable resistor. This provides positive "on" and "off" operation of the control in different load applications and with different magnitudes of input control signals.

A multistage contoller and indicator is provided by staging a plurality of similar unijunction relaxation oscillators through associated clamping diodes and output switching transistors, each stage having a differential adjusting feedback resistor and a firing point adjusting resistor. By adjusting the firing point of each oscillator to cause unclamping in response to an associated predetermined level of the input signal, the stages become unclamped in sequence to provide associated output signals at various corresponding levels of the input control signal to provide sequential switching and a digital indication of the magnitude of the input signal.

Features and advantages of the invention will be seen from the above, from the following description of the preferred embodiment when considered in conjunction with the drawing and from the appended claims.

The drawing is a simplified schematic wiring diagram of the subject electronic switching control, multi-staged to sequentially operate output relays 1RY through 6RY of a six stage switching controller, intermediate stages 2RY through 5RY being omitted for convenience, as is indicated by the broken line interconnection between the first and sixth stages.

Unidirectional power from any convenient source is applied over supply lines B+ and B− to the circuitry. An input control signal is applied to the six stages of the electronic switch from a voltage divider comprising resistor R7 and thermistor TS interconnected between supply lines B+ and B−, the interconnection to supply line B− being indicated by the symbol for ground. Resistor R7 is variable and may be adjusted to a desired ohmic value to establish a "set point" for the control. The condition responsive resistive element, for convenience, is shown as being a thermistor TS responsive to changes in temperature in a heated space (not shown), the heat supply to which space is controlled by output relays 1RY to 6RY it being understood, however, that any condition responsive resistive element may be used. For example, a potentiometer actuated by pressure changes or by humidity variations (where the control responds to changes in pressure or humidity, respectively) may be used. It is also to be understood that, although the controlled load is shown, for convenience, as being relays, the subject electronic control may be used to control other electrical apparatus, such as, electric lights or other electrically powered devices coming within the capability of its power rating.

Taking the first stage of the controller as a single stage electronic switch, there is provided a unijunction transistor 1UJT with its emitter electrode E connected through a clamping diode 1D1 to the junction of thermistor TS with set point resistor R7 of the voltage divider circuit. Emitter E of transistor 1UJT is also connected to the junction of resistor 1R6 with capacitor 1C1 of a resistor-capacitor timing circuit, resistor 1R6 being connected through a current limiting resistor 1R1 to supply line B+. Capacitor 1C1 is connected at its other end to the cathode of a blocking diode 1D2 and to the base electrode of a switching transistor 1Q. The anode of diode 1D2 is connected to supply line B−, while the emitter electrode of transistor 1Q is also connected to supply line B−, such that diode 1D2 shunts the base-emitter diode circuit of switching transistor 1Q. The collector electrode of transistor 1Q is connected to one side of the coil of output relay 1RY, the other side of which relay coil is connected to supply line B−. Relay 1RY, for convenience, is shown as being provided with single pole, double throw contacts, designated generally 1SPC, for interconnection to controlled equipment, such as electric heaters (not shown). A small filtering capacitor 1C2 is connected across the coil of relay 1RY to delay the "drop-out" of the relay.

First base B1 of unijunction transistor 1UJT is connected to supply line B−, while its second base B2 is connected through a current limiting resistor 1R4 to the arm of an adjustable rheostat 1R2 connected in a voltage divider network, comprising rheostat 1R2 and fixed resistor 1R3. The voltage divider is connected from the left hand side of the current limiting resistor 1R1 to supply line B−. Selection of the ohmic value of rheostat 1R2 establishes the voltage across bases B2 and B1 of unijunction transistor 1UJT and, in turn, the potential at which its emitter electrode E must be raised to cause the unijunction transistor to fire and conduct through its emitter base B1 circuit. An adjustable resistor 1R5 is connected between base B2 of transistor 1UJT and the collector electrode of transistor 1Q to provide positive feedback around the switching circuit. Zener diode 1Z provides voltage regulation.

The other five stages of the control are similar to the first stage, each being connected to the common voltage divider junction by an associated clamping diode (2D1–6D1).

In one tested embodiment of the invention, unijunction transistors (1UJT–6UJT) were selected of the G.E. 5E35 type, while switching transistors (1Q–6Q) were selected of the G.E. 2N3393 NPN type.

Resistors (1R6–6R6) are selected at 22 kilohms, capacitors (1C1–6C1) were selected at .01 microfarad, while capacitors (1C2–6C2) were 20 microfarads.

With respect to the operation of the first stage of the control, assume that power is supplied to the circuitry from any convenient source (not shown) and the temperature sensed by thermistor TS is above a certain predetermined temperature, below which temperature more heat would be required from the heating plant (not shown) by the control. Under such conditions, thermistor TS has an ohmic value which places a voltage or potential at the cathode of clamping diode 1D1 at a level insufficient to allow capacitor 1C1 to charge to the firing point of unijunction transistor IUJT. This firing point required at the emitter E at transistor 1UJT, as was previously stated, is established by the position of the pointer of potentiometer 1R2, which position establishes the voltage applied through resistor 1R4 across bases B2 and B1 of unijunction transistor 1UJT. Capacitor 1C1, therefore, charges to the potential placed at the cathode of clamping diode 1D1, thereby clamping the unijunction relaxation oscillator to a non-oscillating condition, the charging circuit extending from supply line B+ through current limiting resistor 1R1, resistor 1R6, capacitor 1C1, the base-emitter diode circuit of switching transistor 1Q to supply line B−. Under such conditions, although switching transistor 1Q conducts through its collector-emitter circuit for an initial cycle, capacitor 1C2 does not charge sufficiently during this initial cycle to effect operation of relay 1RY.

Next, assume that the temperature sensed by thermistor TS decreases sufficiently to raise the ohmic value of the thermistor to the point where the potential at the cathode of clamping diode 1D1 becomes raised above the predetermined firing point of unijunction transistor 1UJT. This decrease in temperature indicates a requirement for more heat, to which the subject control responds as follows: With such potential at the cathode of clamping diode 1D1, capacitor 1C1 in the resistor-capacitor firing circuit of unijunction transistor 1UJT charges toward the required firing potential. This charging of capacitor 1C1 through the base-emitter diode circuit of output switching transistor 1Q causes transistor 1Q to conduct heavily through its emitter-collector circuit, extending through the coil of relay 1RY and capacitor 1C2. This allows shunting capacitor 1C2 to charge to substantially the supply voltage at line B+, causing sufficient current flow through the coil of relay 1RY to operate the relay. Relay 1RY, upon operation, actuates its output contacts 1SPC causing operation of the heating plant (not shown) to supply more heat, as required by thermistor sensor TS.

When capacitor 1C1 has charged sufficiently, the potential at the emitter E of unijunction transistor 1UJT is raised sufficiently to cause the unijunction transistor to fire and conduct through its emitter-base B1 circuit.

As unijunction transistor 1UJT fires, capacitor 1C1 discharges through its emitter-base B1 circuit, the discharging circuit path extending from the top side of capacitor 1C1 through emitter E, base B1 of transistor 1UJT, supply line B— and through shunting diode 1D2 to the other side of capacitor 1C1. The discharge time of capacitor 1C1 is substantially very fast compared to its charging time.

As capacitor 1C1 discharges, the potential at the anode of clamping diode 1D1 and, in turn, at the emitter E of unijunction transistor 1UJT falls below the value necessary to maintain it conducting, causing the unijunction transistor to cease conducting momentarily while capacitor 1C1 recharges. This charging and discharging sequence is repeated such that unijunction transistor 1UJT and its associated circuitry functions as a unijunction relaxation oscillator. Since the discharge time of capacitor 1C1 is relatively small compared to its charging time, output switching transistor 1Q1 is in non-conducting condition only a relatively short time each cycle. Shunting capacitor 1C2 filters the coil of relay 1RY to maintain the relay in its operated condition during such short "off time" of output switching transistor 1Q.

Next, assume that the temperature sensed by thermistor TS (due to the operation of the heating equipment (not shown) controlled by relay 1RY) is raised sufficiently so that the ohmic value of thermistor TS decreases to a point where the potential at the cathode of diode 1D1 and at emitter E of transistor 1UJT is reduced to below the potential required to cause capacitor 1C1 to charge to the firing point of unijunction transistor 1UJT. Under such conditions, the unijunction transistor relaxation oscillator is again clamped to a non-oscillating condition by the potential at clamping diode 1D1, since capacitor 1C1 is again prevented from charging to the firing point of the unijunction transistor. With such cessation of oscillation output switching transistor 1Q is again maintained in non-conducting condition through its emitter-collector circuit, after the last discharging of capacitor 1C1. Under such conditions, shunting capacitor 1C2 discharges through the coil of relay 1RY. Relay 1RY de-energizes and returns to its unoperated condition.

Relay 1RY (which may control an electric heater or a gas valve for a furnace) then ceases to cause heat to be sent to the area being monitored by thermistor TS.

The differential between unijunction transistor 1UJT being operated to its "on" condition and to its "off" condition is adjustable by the ohmic settig of adjustable feedback resistor 1R5. The ohmic value of resistor 1R5 is set such that the positive feedback circuit shunting across the load circuit, under conditions where switching transistor 1Q conducts, provides a certain amount of current flow from supply line B+ through resistors 1R1, 1R2, 1R4 and 1R5 and through the emitter-collector circuit of transistor 1Q to supply line B—. This amount of current flow through resistor 1R5 lowers the potential appearing across bases B2 and B1 of unijunction transistor 1UJT. This lowered base potential, in turn, proportionately lowers the potential required at emitter E of the unijunction transistor to cause it to fire. With such potential lowered, capacitor 1C1 must be prevented from recharging above a proportionately lower value to stop unijunction transistor 1UJT from firing. In such case, the temperature sensed by thermistor TS need be raised a differential amount above that required for initial firing of the oscillator. Therefore, enough heat must be provided to reduce the potential at the cathode of clamping diode 1D1 sufficiently to prevent capacitor 1C1 from recharging at the next cycle to above the now lowered trigger potential. This reclamps the relaxation unijunction oscillator, causing transistor 1Q to remain non-conducting and relay 1RY to release, stopping further heat supply. In this manner by the setting of feedback resistor 1R5 the differential between the "on" and "off" conditions of output transistor 1Q may be set to provide the required on and off operation of the electrical load and the heating plant.

It may also be noted that by coupling switching transistor 1Q to the output of the unijunction relaxation oscillator through shunting diode 1D2 a relatively large output signal may be obtained from the oscillator without loading the circuit.

It can be seen that sequential switching is obtained from the plurality of similar unijunction relaxation oscillator and associated output switching transistor controls by connecting them as stages through associated clamping diodes (1D1–6D1) to the voltage divider network of resistor R7 and thermistor TS. Each stage of the multistage controller (6 stages being shown, for convenience) may thus, be caused to operate in any desired sequence by adjusting the firing point of each oscillator to a progressively higher or lower firing voltage (as was previously described) by means of its associated firing point adjusting rheostat (1R2 through 6R2). The individual differential operating points of each stage may also be adjusted by means of the associated feedback resistors (1R5–6R5).

It should be noted, that the input control signal to the subject control need not be obtained from a voltage divider network (as shown) but may instead by applied in any other convenient manner and may be amplified where required.

It should also be understood that the subject multistage controller can function as a digital temperature indicator such indication being given by the condition of output relays 1RY through 6RY. Furthermore, indicating lamps may be substituted for the relays or energized by them and the subject circuitry utilized as a digital voltmeter, the input control signal to the clamping diodes being a monitored voltage.

As changes can be made in the above described construction and many apparently different embodiments of this invention can be made without departing from the scope thereof, it is intended that all matter contained in the above description or shown on the accompanying drawing be interpreted as illustrative only and not in a limiting sense.

What is claimed is:

1. A control for an electrically powered load selectively energizable in response to an input signal, said control comprising:

unijunction relaxation oscillator means, clamping means responsive to said input signal for clamping said oscillator means in non-oscillating state, under conditions where said input signal is at a first predetermined characteristic, and for unclamping said oscillator means, under conditions where said input signal is at a second predetermined characteristic;

electronic switching means operative, when in an "on" condition for causing energization of said electrical load from its said power source and when in an "off" condition for disconnecting said load from its said power source;

said switching means being electrically coupled to the output of said relaxation oscillator means and responsive thereto for performing its such switching function with each oscillation; and said switching means being maintained in said "off" condition by said oscillator means, under conditions where said oscillator means is clamped to non-oscillating condition.

2. A control as set forth in claim 1 wherein there is provided:

energy storage means responsive to operation of said switching means and operative for maintaining said electrical load energized during the "off" portions of the oscillating cycle of said electronic switching means.

3. A control as set forth in claim 1 wherein there is provided:

means for adjusting the first point at which said oscillator means responds to said second predetermined characteristic of said input signal for unclamping said oscillator means.

4. A control as set forth in claim 3 wherein there are provided a plurality of said combinations of oscillators, associated clamping means and associated electronic switching means coupled for response to said input signal, and wherein each of said combinations are provided with means for adjusting said first point at which its oscillator means responds through its associated clamping means to said input signal to provide selective operation of each of said control combination to different associated characteristics of said input signal.

5. A control as set forth in claim 3 wherein there is further provided means for selectively changing said second point at which said oscillating means responds to said first predetermined characteristic of said input signal for being reclamped to said non-oscillating condition to provide an adjustable differential between said oscillating and non-oscillating conditions in response to variations of said input signal.

6. A control as set forth in claim 5 wherein said oscillator means includes a unijunction transistor having an emitter electrode and a resistor-capacitor firing network connected to said emitter electrode of said unijunction transistor, and wherein a diode clamps said emitter electrode to the voltage level of said input signal applied to the cathode of said diode.

7. A control as set forth in claim 6 wherein said means for adjusting the firing point at which said oscillator means responds includes an adjustable resistor connected in the voltage supply circuit for the first and second bases of said unijunction transistor.

8. A control as set forth in claim 7 wherein said electronic switching means comprises a switching transistor and a blocking diode shunting the base-emitter diode circuit of said switching transistor to provide a discharging path through said unijunction transistor for said capacitor of said firing network, said switching transistor providing through its base-emitter diode circuit a charging path for said firing capacitor.

9. A control as set forth in claim 8 wherein an adjustable resistor is interconnected between the first base of said unijunction transistor and the collector electrode of said switching transistor to provide a positive feedback path around said load for lowering the potential appearing across the first and second bases of said unijunction transistor during periods of conduction of said switching transistor through its emitter-collector circuit, such lowering in turn, proportionately lowering the potential required at the emitter of said unijunction transistor which need be applied through said clamping diode in response to said input signal for reclamping said unijunction relaxation oscillator to non-oscillating condition.

10. A control for an electrically powered load selectively energizable in response to variations of an input signal, said control comprising, a voltage divider network having two legs connected at a junction;

a condition responsive resistive element forming one leg of said divider network;

a unijunction relaxation oscillator including a unijunction transistor having first base, second base and emitter electrodes and also including a resistor and capacitor timing circuit means for providing a firing circuit for said unijunction transistor;

a clamping diode coupling said unijunction oscillator to the junction of said condition responsive resistive element leg with the other leg of said voltage divider network to provide a clamping input potential signal to said oscillator for controlling oscillation thereof;

switching transistor means coupled to the output of said oscillator and responsive thereto, said switching transistor mean including base, emitter and collector electrodes;

said load being interconnected in said emitter-collector circuit for energization therethrough;

the base-emitter diode circuit of said output switching transistor providing a charging path for the said firing capacitor of said oscillator for controlling conduction through the emitter-collector circuit of said switching transistor; and a blocking diode shunting the base-emitter diode circuit of said switching transistor and poled to provide a discharging path for said firing capacitor through the emitter-first base circuit of said unijunction transistor.

11. A control as set forth in claim 10 wherein for said relaxation oscillator there is included means for adjustably providing a predetermined potential across said first and second bases of said unijunction transistor, and wherein there is provided feedback means, effective during conduction of said switching transistor through its emitter-collector circuit, for reducing the said predetermined potential appearing across said first and second bases of said unijunction transistor to proportionately lower the clamping potential signal required for said oscillator.

12. A control for an electrically powered load selectively energizable in response to an input signal, said control comprising, condition responsive input signal means providing an input potential signal in response to variations in a predetermined condition sensed, a unijunction transistor including first base, second base and emitter electrodes, means applying a potential across said first and second bases, a resistor and a capacitor, said capacitor having two terminals, a first one of which connects to said resistor to form a series resistor-capacitor timing circuit for said unijunction transistor, said emitter of said unijunction transistor being connected directly to said first terminal of said capacitor, a clamping diode connecting said emitter electrode to the output of said input potential signal means for controlling charging of said capacitor in accordance with the level of said signal, a blocking diode interconnected to said other terminal of said capacitor in said resistor-capacitor timing circuit for providing a discharging current path for said capacitor through said emitter-first base diode circuit of said unijunction transistor, an output switching transistor having a base, emitter and collector electrodes, the said base electrode of said switching transistor being connected to said other terminal of said capacitor, said load being connected in the collector-emitter circuit of said switching transistor in series with a power source for energization in response to conduction through said collector-emitter circuit, the said base-emitter diode circuit of said output switching transistor providing a charging path for said capacitor, and said capacitor, under conditions where said input signal applied through said clamping diode is above a certain level, charging sufficiently to cause firing of said unijunction transistor and heavy conduction of said output switching transistor through its said emitter-collector circuit including said load.

References Cited

UNITED STATES PATENTS

| | | | |
|---|---|---|---|
| 2,981,898 | 4/1961 | St. John | 317—148.5 X |
| 3,132,261 | 5/1964 | Weber | 307—237 X |

| | | | |
|---|---|---|---|
| 3,299,288 | 1/1967 | McDowell et al. | 307—237 |
| 3,349,255 | 10/1967 | McAvoy | 307—237 X |

OTHER REFERENCES

Carvajal: "Phototransistor Regulates Illumination Intensity," Electronics, vol. 38, No. 20, 10/65, page 101.

DONALD D. FORRER, Primary Examiner

B. P. DAVIS, Assistant Examiner

U.S. Cl. X.R.

307—237, 253, 293, 301; 317—148.5